(12) United States Patent
Perratone et al.

(10) Patent No.: US 8,890,071 B2
(45) Date of Patent: Nov. 18, 2014

(54) METHOD FOR ASSEMBLING AND HERMETICALLY SEALING AN ENCAPSULATING PACKAGE

(75) Inventors: Frédéric Perratone, Grenoble (FR); Didier Simon, Rovon (FR)

(73) Assignee: Ulis, Veurey Voroize (FR)

( * ) Notice: Subject to any disclaimer, the term of this patent is extended or adjusted under 35 U.S.C. 154(b) by 432 days.

(21) Appl. No.: 13/336,501

(22) Filed: Dec. 23, 2011

(65) Prior Publication Data

US 2012/0193534 A1   Aug. 2, 2012

(30) Foreign Application Priority Data

Feb. 2, 2011   (FR) ...................................... 11 50815

(51) Int. Cl.
| | |
|---|---|
| *H01L 21/56* | (2006.01) |
| *H01L 27/146* | (2006.01) |
| *G01J 5/04* | (2006.01) |
| *H01L 23/10* | (2006.01) |
| *H01L 23/26* | (2006.01) |
| *G01J 5/20* | (2006.01) |

(52) U.S. Cl.
CPC ........... *H01L 27/14618* (2013.01); *G01J 5/045* (2013.01); *H01L 23/10* (2013.01); *H01L 23/26* (2013.01); *G01J 5/20* (2013.01); *H01L 2924/0002* (2013.01)
USPC ...................................................... 250/330

(58) Field of Classification Search
CPC ..................................................... H01L 21/56
USPC ...................................... 250/330, 338.1, 332
See application file for complete search history.

(56) References Cited

U.S. PATENT DOCUMENTS

| | | | |
|---|---|---|---|
| 4,558,255 A | * | 12/1985 | Genovese et al. .............. 313/497 |
| 4,956,554 A | | 9/1990 | Baker et al. |
| 5,012,102 A | * | 4/1991 | Gowlett ......................... 250/352 |
| 5,317,157 A | | 5/1994 | Yoshida et al. |
| 6,428,650 B1 | * | 8/2002 | Chung ............................ 156/250 |
| 7,470,904 B1 | | 12/2008 | Schweikert et al. |
| 7,795,585 B2 | | 9/2010 | Sogawa et al. |
| 2002/0056898 A1 | | 5/2002 | Lopes et al. |
| 2002/0117623 A1 | * | 8/2002 | Cole ........................... 250/338.1 |

FOREIGN PATENT DOCUMENTS

EP   2 065 930 A1   6/2009

* cited by examiner

*Primary Examiner* — David Porta
*Assistant Examiner* — Faye Boosalis
(74) *Attorney, Agent, or Firm* — Burr & Brown, PLLC

(57) ABSTRACT

A method of assembling and hermetically sealing a package including a side wall mounted on a substrate, with the space thus defined accommodating a component that operates in a controlled atmosphere, the space being closed off by a hermetic sealing cover mounted on said side wall. This method involves depositing a metallic connector element, also referred to as a brazing preform, on the upper face of the side wall; depositing the upper cover on, and in contact with, the brazing preform; subjecting the assembly thus obtained to the desired environment in terms of the kind of gas and operating pressure of the component; increasing the temperature to a value that is at least in excess of the melting temperature of the material that constitutes the brazing preform; then lowering said temperature in order to cause solidification of said brazing material and, consequently, sealing of the cover on the side wall.

13 Claims, 2 Drawing Sheets

METHOD FOR ASSEMBLING AND HERMETICALLY SEALING AN ENCAPSULATING PACKAGE

FIELD OF THE INVENTION

The present invention relates to the field of optical, electronic or microelectronic components that operate in a vacuum or at reduced pressure. More specifically, the invention has a particular application in the field of microbolometer-based imaging (i.e. bolometers that operate at ambient temperature), such as in the field of thermal infrared detection in particular.

A certain number of components, regardless whether they are active (micro-vibrators, accelerometers) or passive (detectors, especially infrared detectors), need to operate in a vacuum or at reduced pressure. This being so, in order for them to operate, such components are encapsulated in a hermetically sealed package that is capable of preserving the requisite operating pressure at the time they are assembled. In addition, because of their assembly, their operating mode or even their operating temperature, the pressure inside the hermetically sealed package in question may change over time and rise, in particular, in a manner that is capable of degrading their performance and requires the use of appropriate devices or elements in order to extend the longevity of the components in question.

In realizing such components, one is therefore confronted with a mainly economic set of problems that are related to the size of the components in question, the ingredients used and/or assembly techniques as well as the yield of said technologies and, finally, the effective service life of the components which is directly related to changes in the pressure inside the package which, as stated above, must remain sufficiently low throughout the entire life of said component.

The following description is more especially relevant to thermal imaging. The reader must, however, bear in mind that the purpose of the invention is applicable to any component that requires a vacuum or a reduced pressure in order to operate and perform correctly.

BACKGROUND ART

FIG. 1 shows a schematic cross-sectional view of an encapsulating package of a bolometric detector according to the prior art that is typically used for thermal infrared detection. Package 1 essentially comprises a substrate 2 made, for example, of a ceramic material or metal or even a combination of both these types of materials. This substrate constitutes the base of package 1. It is provided with side walls 3 and the enclosure 4 thus defined is closed off by a cover or lid 5 which, in this case, has a window 6 that is transparent to the wavelength range that is of interest (typically 8-12 micrometers or 3-5 micrometers in the case of infrared imaging).

Package 1 thus defined comprises, inside enclosure 4, a bolometric detector 7 which is located underneath window 6. This bolometric detector, e.g. a two-dimensional retina of microbolometers, is generally produced on the surface of an electronic circuit 8 that forms the wanted signal and which is itself linked to the external environment via a series of low-power inputs/outputs 9, usually by wired connections. These inputs/outputs are connected to the electronics of the system that includes the detector, typically a camera, by usual means of the solder type or by means inserted in a PCB.

Side walls 3 are sealed on substrate 2 and cover or lid 5 is sealed on the upper edge of side walls 3 in a manner which ensures that the pressure inside enclosure 4 is typically less than $10^{-2}$ mbar throughout the entire service life of the product. This hermetic sealing is also performed so that the leak rate is typically less than $10^{-12}$ mbar l/s in helium.

Maintenance of this reduced pressure is ensured by means of an element traditionally referred to as a getter 10, i.e. a member that comprises a material capable of absorbing and generally trapping gas molecules that are released during the life of the detecting component and which originate from all the surfaces of the constituents that are in communication with the space inside enclosure 4.

Such a getter material can be solid, i.e. consist of sintered powder having a generally cylindrical shape, possibly with a refractory metal wire passing through it and being used to fix and electrically activate the getter by the Joule effect. The getter may also be deposited by using various methods such as screen printing or Physical Vapor Deposition (PVD) on a preferably metallic support 11 which can, as in the case of solid getters, be used as a means of fixing and electrically connecting the getter. In this case, electrical connection 12 is a high-power input/output in order to enable electrical activation of the getter by the Joule effect.

Such devices according to the prior art are described, for example, in Documents U.S. Pat. No. 7,470,904, U.S. Pat. No. 4,956,554 and U.S. Pat. No. 5,317,157.

Activation of the getter is obtained by increasing the temperature, after enclosure 4 has been exhausted by pumping, of the active getter material to (usually) between 300 and 900° C., depending on the alloy used in the active part of the getter. This temperature increase is obtained by the Joule effect, i.e. by passing an electric current through the resistive metal support or by increasing the temperature of the enclosure of the package, and hence the getter, to the required activation temperature.

Regardless of the package used, getter 10 is fixed inside the latter during a specific step that is separate from the step of fixing the detector and, generally speaking, the other elements that are required in order to assemble the various constituents of the finished component (product). This operation is expensive in terms of tools and materials and also requires a lot of labor.

The object of the present invention is precisely to simplify this operation.

SUMMARY OF THE INVENTION

It relates firstly to a method for assembling and hermetically sealing a package consisting of a side wall mounted on, or integral with, a substrate, with the space thus defined accommodating at least one component that operates in a vacuum or at reduced pressure or, more generally, in a controlled atmosphere, said space being closed off by a hermetic sealing cover sealed on said side wall, with this method involving:
- depositing a metallic connector element, also referred to as a brazing preform, onto the upper face of the side wall;
- depositing the upper cover on, and in contact with, said preform;
- subjecting the assembly thus obtained to the desired environment in terms of the kind of gas and operating pressure of the component;
- increasing the temperature to a value that is at least in excess of the melting temperature of the material that constitutes the brazing preform;
- then lowering said temperature in order to cause solidification of said brazing material and, consequently, sealing of the cover on the side wall.

According to the invention:
at least one recess is provided in the side wall, capable of accommodating a functional element mounted so that it overhangs, said functional element being shaped accordingly;
then, after fitting said functional element, depositing the brazing preform and then the cover, thereby causing cooperation of said functional element with the preform and, consequently, positioning of the latter in accordance with its operating mode.

In other words, the invention involves providing, in a single step, an operation to fix the functional element and, for example, the getter element, and sealing the package.

According to the invention, when the temperature is increased, the brazing material of the preform migrates and, after melting, ensures attachment of the functional element to the package.

The invention also relates to a method of the type in question that is more especially intended to produce a hermetically sealed package that contains an infrared imaging retina and a getter element. In this application, the upper cover includes a window that is transparent to at least one specified wavelength range and positioned so that it substantially faces the infrared imaging retina which typically consists of a bolometric detector that is directly or indirectly mounted on the substrate of the package.

The invention also relates to a device comprising a component fitted in a hermetically sealed package inside which it is possible for there to be a vacuum or reduced pressure or, generally speaking, a controlled atmosphere, with said package consisting of a side wall mounted on, or integral with, a substrate, with the space thus defined being closed off by sealing an upper cover. According to the invention:
the side wall has at least one opening or recess in the vicinity of its upper edge;
the package also includes a functional element shaped so that it has at least one protrusion or protuberance capable of being accommodated in the opening or recess provided in the side wall and whereof the center of gravity is located outside the support perimeter defined by the zone where said protrusion or protuberance cooperates with the recess or opening so that the functional element is capable of swiveling from a non-operational position to an operational position after the cover has been sealed on the side wall that defines the package.

In one variant of the above embodiment, the side wall has two openings or recesses in the vicinity of its upper edge made substantially opposite each other and, consequently, the functional element comprises two protrusions or protuberances capable of being accommodated in said openings or recesses, said protrusions or protuberances not being in alignment with the center of gravity of said functional element and their cooperation with the openings or recesses constituting an articulation axis around which the functional element is capable of swiveling from a non-operational position to an operational position after the cover has been sealed on the side wall that defines the package.

According to a more general definition, the center of gravity of the functional element is outside the support perimeter of said element which is itself formed by the envelope of the perimeters of cooperation between the protrusions and the openings.

BRIEF DESCRIPTION OF THE DRAWINGS

The way in which the invention is implemented and its resulting advantages will be made more readily understandable by the description of the following embodiment, given merely by way of example, reference being made to the accompanying drawings.

DETAILED DESCRIPTION OF THE INVENTION

Figure 1:
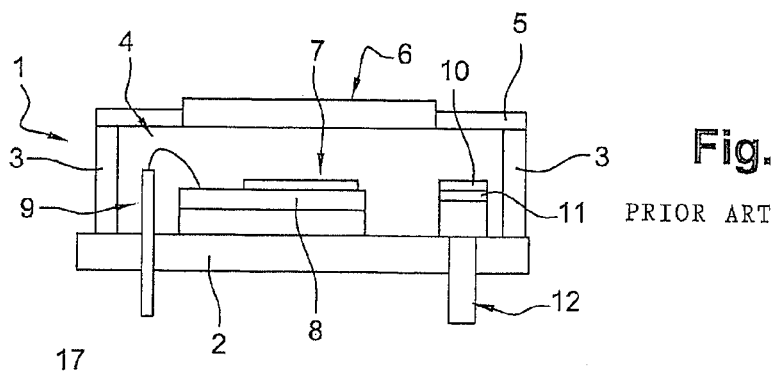
FIG. 1 is, as stated above, a schematic cross-sectional view of a package according to the prior art.
Figure 2A:
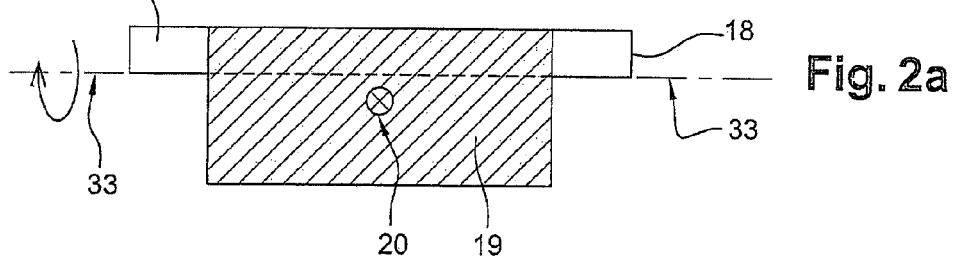
FIGS. 2a and 2b are, respectively, top and side views of a getter element shaped in accordance with one particular embodiment of the invention.
Figure 2B:
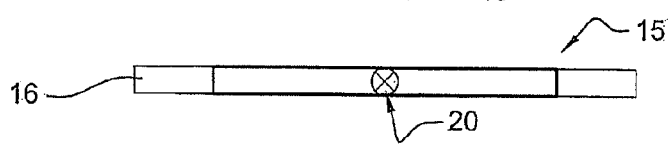

FIGS. 2a and 2b show a getter element 15 used as part of one particular embodiment of the present invention. Basically, the getter element consists of a metal sheet 16. This metal sheet 16 is advantageously covered by a galvanic surface treatment consisting of nickel and gold, at least at the level of areas 17 and 18 which, in this case, are opposite each other and protrude or project relative to the rest of the element; their function will be described in detail later on.

The rest of metal sheet 16 has one of its main faces, but advantageously both its faces, covered in an actual getter material which is typically capable of absorbing, by chemisorption, gases that are present in the enclosure defined by the package according to the invention in an area 19 which, in this case, is rectangular.

In FIG. 2a it is apparent that the size of main active area 19 of rectangular-shaped getter element 15 is considerably larger than areas 17 and 18. Because of this, the center of gravity 20 of getter element 15 is offset relative to the area that links areas 17 and 18; the reason for this offset is indicated below.

Figure 3A:
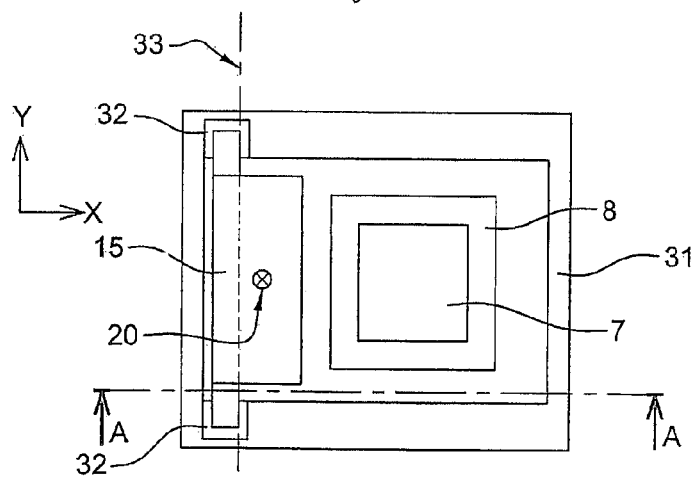
FIGS. 3a and 3b are schematic representations, viewed from above and from the side, showing how the getter shown in FIGS. 2a and 2b is fitted inside a package in accordance with the invention prior to the operation in which said package is sealed.
Figure 3B:
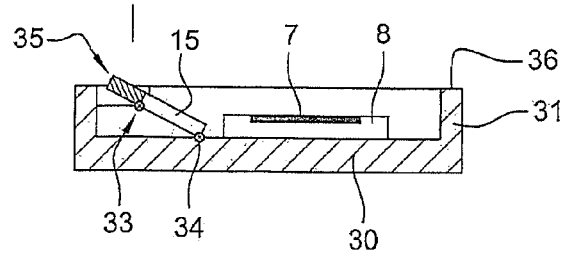

FIGS. 3a and 3b show how getter element 15 is fitted inside the package according to the invention.

This package has a substantially parallelepiped shape and is defined by a base 30, in this case a substrate, and a continuous side wall 31. Base 30 of the package accommodates a bolometric detector 7 associated with its readout circuit 8 in a known manner.

Figure 4:
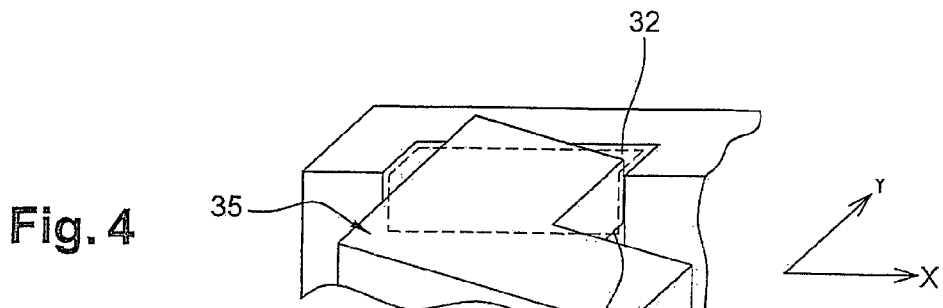
FIG. 4 is a schematic representation intended to illustrate more precisely a recess provided in the side wall of the package which cooperates with a part or protuberance of the getter element and is in conformity with the embodiment shown in FIGS. 3a and 3b.

In contrast, according to the invention, side wall 31 has, in the vicinity of its upper surface, two special-purpose recesses 32 that are described in more detail in relation to FIG. 4. These special-purpose recesses are located facing each other at the level of the upper edge of wall 31 and have a shape that matches areas 17 and 18 of getter element 15. In this case, they have a substantially parallelepiped shape.

Because the center of gravity 20 of getter element 15 is offset, the getter is capable of swiveling in these recesses 32 relative to an articulation axis that is defined by the generatrix of the lower inside edge 33 of areas 17 and 18. This articulation axis 33 is shown in FIGS. 2 and 3. In mechanical terms, swiveling takes place when the center of gravity of getter element 15 lies outside the support perimeter of said element on recesses 32, which is itself formed by the envelope of the cooperating (or superposed) surfaces of areas 17, 18 and of recesses 32. This perimeter is formed in FIG. 3a, in the case being described, by the rectangle that links together areas 17 and 18, whereof the lower face is dashed-line axis 33.

Thus, when the operator has placed getter element 15 in side wall 31 and, more especially, after having positioned areas 17 and 18 of said element in corresponding recesses 32, under its own weight and because of its dimensional characteristics (especially its offset center of gravity 20), getter element 15 swivels, naturally and due to effect of gravity, relative to axis 33 until another of its generatrices 34 (in this case) comes into contact with the base 30 of the package (see FIG. 3b). This being so, the opposite end and, in particular, opposite generatrix 35 of getter element 15 protrudes relative to the upper plane defined by the upper face 36 of side wall 31, as shown, in particular, in FIG. 3b.

It should be noted that, because of the particular design of getter element 15, it is substantially incapable of moving in directions X and Y (e.g. directions shown in FIG. 4) due to the particular shape of recesses 32 and matching areas 17 and 18. In other words, it only has one degree of freedom, namely rotation relative to generatrix 33.

Furthermore, the sizing of getter element 15, relative to its course as it freely rotates before resting against the base (in this case), is such that it protrudes slightly above the upper surface of side wall 31. This arrangement, shown in FIGS. 3b and 4, will be better understood during the next operation A brazing preform 40, typically consisting of an alloy of gold and tin, which rests on the upper face 36 of side wall 31 is then fitted. An encapsulating cover or, as in the example described, a window holder 41, a second brazing preform 42 on said window holder 41 and, finally, a window 43 that is transparent to the wavelength range that is of interest to bolometric detector 7, are placed directly on this preform 40.

Figure 5:
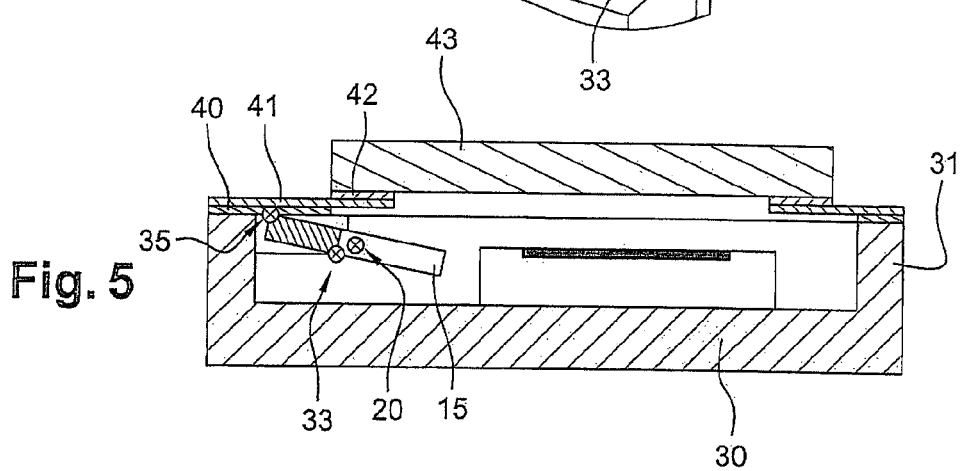
FIG. 5 is a schematic side-view representation of the package in FIGS. 3a and 3b after the encapsulating cover, in this case provided with a window that is transparent to a specified wavelength range, has been fitted.

Because of the positioning of these elements 40, 41, 42, 43, getter element 15 cooperates through its generatrix 35 with brazing preform 40, thus causing it to swivel relative to axis 33, essentially as shown schematically in FIG. 5.

Note that, in this case, getter element 15 overhangs and, in particular, is in constant mechanical contact with preform 40; this condition is conducive to satisfactory completion of the process in terms of final assembly quality.

The package thus defined is placed in an enclosure in which there is a vacuum or, generally speaking, the desired atmosphere (kind of gas and pressure) and the temperature of said enclosure is then increased to a value in excess of the melting temperature of the brazing materials of preforms 40 and 42 in order to obtain hermetic sealing of the package in a known manner.

Figure 6:
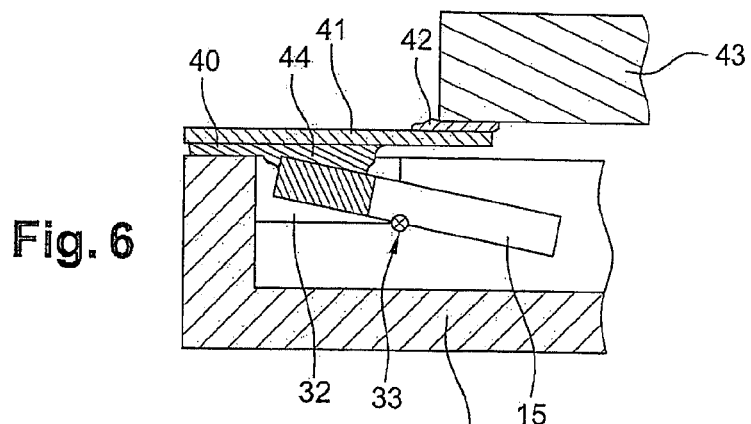
FIG. 6 is a more accurate schematic side-view representation of FIG. 5 after the preform has melted.

FIG. 6 shows the migration of brazing material 40 which constitutes a fixing and cooperation area 44 between getter element 15 and window holder 41.

Figure 7:
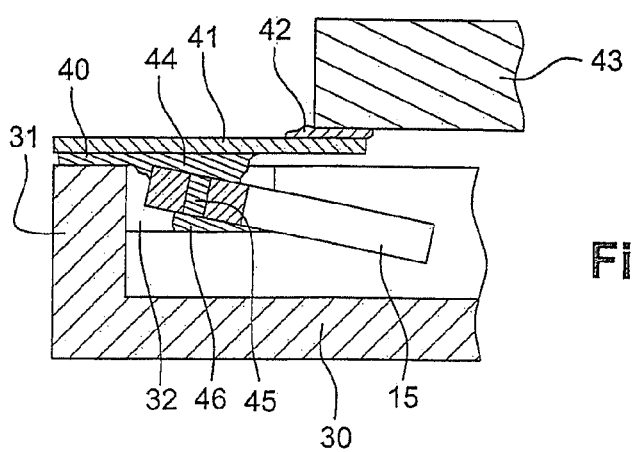
FIG. 7 is a view, similar to FIG. 6, of an alternative embodiment of the invention.

There may, however, be a requirement to fix said getter element more securely, as in the particular arrangement shown in FIG. 7. To do this, areas 17 and 18 of the getter element are provided with at least one through-opening 45 which, after preform 40 has melted, allows partial flow of the brazing material into the lower area as far as the lower face of recesses 32, thus defining an additional fixing area 46. To achieve this, the lower face and the through-opening(s) of recesses 32 is/are advantageously provided with a layer that is wettable by the brazing material.

A particular embodiment of the invention which uses two recesses 32 intended to cooperate with two protrusions of the getter element is described above. However, it must be understood that the invention is also able to operate with a single recess in its side wall and is capable of cooperating with a single protrusion or protuberance of the getter element. The overhang of said getter element when it is fitted, using the protrusion or protuberance, in the recess provided for this purpose and, consequently, its cooperation with the brazing preform are important to note.

The great attraction of the method and the device according to the invention is obvious insofar as, during the actual operation of sealing said hermetically sealed package, one concomitantly obtains orientation and fixing of the getter element inside such a package, without the need for any additional step. This operation is made possible very simply by merely dimensioning and shaping the getter element—apart from the side wall which defines said package, the other steps are conventional. This produces significant time savings which result in considerably lower manufacturing costs.

The invention claimed is:

1. A method for assembling and hermetically sealing a package consisting of a side wall mounted on, or integral with, a substrate, with the space thus defined accommodating at least one component that operates in an environment of one of a vacuum, reduced pressure and a controlled atmosphere, said space being closed off by a hermetic sealing cover sealed on said side wall, with this method comprising:
   depositing a metallic connector element, also referred to as a brazing preform, onto the upper face of side wall;
   depositing the upper cover on, and in contact with, said brazing preform;
   subjecting the assembly thus obtained to the desired environment in terms of a kind of gas and operating pressure of the component;
   increasing the temperature to a value that is at least in excess of the melting temperature of the material that constitutes the brazing preform;
   then lowering said temperature in order to cause solidification of said brazing material and, consequently, sealing of the cover on the side wall,
   wherein at least one recess is provided in the side wall capable of accommodating a functional element mounted so that said functional element overhangs said at least one recess, said functional element being shaped accordingly;
   and then, after fitting said functional element, the brazing preform is deposited and then the cover is also deposited in said recess, thereby causing cooperation of said functional element with the preform and, consequently, positioning said functional element in accordance with its operating mode.

2. The method for assembling and hermetically sealing a package as claimed in claim 1, wherein, when the temperature is increased, the brazing material of brazing preform migrates and ensures, after melting and then solidifying, attachment of said functional element to the package.

3. The method for assembling and hermetically sealing a package as claimed in claim 2, wherein said functional element has at least one through-hole in its areas which cooperates with the at least one recess and wherein the brazing material of preform partially migrates through the at least one through-hole in order to obtain attachment of said functional element with said at least one recess.

4. The method for assembly and sealing a package as claimed in claim wherein said functional element is fitted into the at least one recess provided in the side wall and said functional element protrudes above an upper surface of the side wall, wherein said functional element contacts and is fixed by the preform to the package during the sealing of the upper cover.

5. A method for assembling and hermetically sealing a package for an infrared detector, said package consisting of a side wall mounted on, or integral with, a substrate, the space thus defined accommodating at least one bolometric detector which operates in an environment of one of a vacuum and reduced pressure, said space being closed off by a hermetic closing cover which includes a window that is transparent to the wavelength range that is of interest, with this method comprising:
  depositing a metallic connector element, also referred to as a brazing preform on the upper face of the side wall;
  depositing a upper cover on, and in contact with said preform;
  subjecting the assembly thus obtained to the desired environment in terms of a kind of gas and operating pressure of the bolometric detector;
  increasing the temperature to a value that is at least in excess of the melting temperature of the material that constitutes the brazing preform;
  then lowering said temperature in order to cause solidification of said brazing material and, consequently, sealing of the cover on the side wall,
  wherein a plurality of recesses are provided in the side wall, each capable of accommodating a getter element mounted so that said getter element overhangs said recesses, said getter element being shaped accordingly;
  and then, after fitting said getter element in said recesses, the brazing preform is deposited and then the cover is deposited, thereby causing cooperation of said getter element with the preform and, consequently, positioning said getter element in accordance with its operating mode.

6. The method for assembling and hermetically sealing a package as claimed in claim 5, wherein, when the temperature is increased, the brazing material of brazing preform migrates and ensures, after melting and then solidifying, attachment of said getter element to the package.

7. The method for assembling and hermetically sealing a package as claimed in claim 6, wherein said getter element has at least one through-hole in its areas which cooperates with recesses in side wall, and the brazing material of preform partially migrates through the at least one through-hole in order to obtain attachment of said getter element with said recesses.

8. The method for assembling and sealing a package as claimed in claim 5, wherein said getter element is fitted into the plurality of recesses provided in the side wall and said getter element protrudes above an upper surface of the side wall, wherein said getter element contacts and is fixed by the preform to the package during the sealing of the upper cover.

9. A device comprising a component fitted in a hermetically sealed package inside which it is possible for there to be one of a vacuum, reduced pressure and a controlled atmosphere, with the package consisting of a side wall mounted on, or integral with a substrate, with the space thus defined being closed off by sealing an upper cover,
  wherein the side wall has at least one of an opening and a recess in the vicinity of its upper edge;
  and wherein the package also includes a functional element shaped so that said functional element has at least one of a protrusion and a protuberance capable of being accommodated in the at least one of said opening and recess provided in the side wall, and said functional element center of gravity is offset outside the support perimeter defined by area of the at least one of said protrusion and protuberance which cooperates with the at least one of said recess and opening, so that the functional element is capable of swiveling from a non-operational position to an operational position through cooperation with a preform during the sealing of the upper cover to the side wall that defines the package.

10. The device comprising a component contained in a hermetically sealed package as claimed in claim 9, wherein the side wall has one of two openings and recesses in the vicinity of its upper edge, said openings and recesses being made substantially opposite each other and, consequently, said functional element has one of two protrusions and protuberances capable of being accommodated in said openings and recesses, with the center of gravity of said functional element being outside the support perimeter of said functional element which is itself formed by the envelope of the cooperation perimeters between said protrusions and protuberances and said openings and recesses, with cooperation of said protrusions and protuberances with said openings and recesses constituting an articulation axis around which said functional element is capable of swiveling from a non-operational position to an operational position after sealing the cover on the side wall that defines the package.

11. The method for assembling and sealing a package as claimed in claim 9, wherein the at least one of said protrusion and protuberance of said functional element is fitted into the at least one of said recess and opening provided in the side wall and said functional element protrudes above an upper surface of the side wall, wherein said functional element contracts and is fixed by the preform to the package during the sealing of the upper cover.

12. A device for infrared imaging comprising at least one bolometer fitted in a hermetically sealed package inside which it is possible for there to be one of a vacuum, reduced pressure and a controlled atmosphere, with said package consisting of a side wall mounted on, or integral with a substrate, with the space thus defined being closed off by sealing an upper cover equipped with a window that is transparent to the wavelength range that is of interest,
  wherein the side wall of the package has one of two openings and recesses in the vicinity of its upper edge that are made substantially opposite each other;
  and wherein the package also includes a getter element shaped so that said getter element has at least one of two protrusions and protuberances capable of being accommodated in said openings and recesses provided in the side wall, with said protrusions and protuberances not being in alignment with the center of gravity of said getter element and said protrusions and protuberances cooperation with said openings and recesses constituting an articulation axis around which said getter element is capable of swiveling from a non-operational position to an operational position through cooperation with a preform during the sealing of the cover to the side wall that defines the package.

13. The method for assembling and sealing a package as claimed in claim 12, wherein the at least one of said protrusion and protuberance of said getter element is fitted into the at least one of said recess and opening provided in the side wall and said getter element protrudes above an upper surface of the side wall, wherein said getter element contacts and is fixed by the preform to the package during the sealing of the upper cover.

* * * * *